United States Patent
Gindele et al.

(10) Patent No.: US 11,719,427 B2
(45) Date of Patent: Aug. 8, 2023

(54) BASE BODY FOR A LIGHT CONVERSION OR ILLUMINATING DEVICE

(71) Applicant: SCHOTT AG, Mainz (DE)

(72) Inventors: Frank Gindele, Schweitenkirchen (DE); Edgar Pawlowski, Stadecken-Elsheim (DE); Christian Rakobrandt, Schwindegg (DE); Christoph Stangl, Buch am Erlbach (DE)

(73) Assignee: Schott AG, Mainz (DE)

( * ) Notice: Subject to any disclaimer, the term of this patent is extended or adjusted under 35 U.S.C. 154(b) by 105 days.

(21) Appl. No.: 16/987,580

(22) Filed: Aug. 7, 2020

(65) Prior Publication Data
US 2021/0044074 A1 Feb. 11, 2021

(30) Foreign Application Priority Data
Aug. 9, 2019 (DE) .................. 10 2019 121 508.0

(51) Int. Cl.
*F21V 9/32* (2018.01)
*F21S 41/176* (2018.01)
*F21V 29/503* (2015.01)
*F21S 43/16* (2018.01)

(52) U.S. Cl.
CPC .......... *F21V 29/503* (2015.01); *F21S 41/176* (2018.01); *F21S 43/16* (2018.01); *F21V 9/32* (2018.02)

(58) Field of Classification Search
CPC .......... F21S 41/176; F21S 43/16; F21V 9/30; F21V 9/32; F21V 9/35
See application file for complete search history.

(56) References Cited

U.S. PATENT DOCUMENTS

| | | | |
|---|---|---|---|
| 2017/0198876 A1 | 7/2017 | Boinet | |
| 2017/0210277 A1 | 7/2017 | Harada et al. | |
| 2017/0210280 A1 | 7/2017 | Suzuki | |
| 2018/0375001 A1* | 12/2018 | Ueno | H01L 33/502 |
| 2019/0257488 A1* | 8/2019 | Hechtfischer | F21V 29/502 |
| 2019/0265583 A1* | 8/2019 | Takahashi | G03B 21/204 |

FOREIGN PATENT DOCUMENTS

| | | |
|---|---|---|
| CN | 106939991 A | 7/2017 |
| DE | 10 2012 005 661 A1 | 9/2013 |
| DE | 10 2012 223 854 A1 | 6/2014 |
| DE | 10 2015 113 562 A1 | 2/2017 |
| DE | 10 2017 101 008 A1 | 7/2018 |
| EP | 3 184 884 A1 | 6/2017 |
| EP | 3 203 140 A1 | 8/2017 |
| WO | 2017/104167 A1 | 6/2017 |
| WO | 2017/111405 A1 | 6/2017 |
| WO | 2017/133809 A1 | 8/2017 |

\* cited by examiner

*Primary Examiner* — Sean P Gramling
(74) *Attorney, Agent, or Firm* — Taylor IP, P.C.

(57) ABSTRACT

A base body for a light conversion device and/or an illumination device is configured as a heat sink. The base body has a front side which is configured to mount a light conversion element on the base body. The base body includes an indicator for positioning/alignment of a light conversion element on the base body, and/or an indicator for positioning/alignment of the base body relative to a component for retention of the base body.

11 Claims, 4 Drawing Sheets

BASE BODY FOR A LIGHT CONVERSION OR ILLUMINATING DEVICE

CROSS REFERENCE TO RELATED APPLICATIONS

This application claims the priority of German Patent Application No. DE 10 2019 121 508.0 filed Aug. 9, 2019, which is incorporated in its entirety herein by reference.

BACKGROUND OF THE INVENTION

1. Field of the Invention

The present invention relates to a base body in the embodiment of a heat sink for a light conversion device and/or an illuminating device, and also relates to the light conversion device and/or the illuminating device with the relevant base body.

2. Description of the Related Art

Illuminating devices are known in various designs, for example so-called discharge lamps and halogen lamps. For various reasons—for example in order to increase the energy efficiency or in order to provide illuminating devices that have a low space requirement and at the same time have high luminance—illuminating devices based on laser sources are of increasing interest. They are generally designed such that they comprise at least one laser light source, for example a laser diode.

The light conversion element serves to receive the laser light source and to again emit it with another wavelength, because the light emitted from the laser light source or laser light sources respectively generally does not have the desired color coordinate, for example color neutral "white" color coordinate. Following irradiation with the light of the laser light source or the laser light sources respectively, the light conversion element is capable of converting same partially or completely into one or several other wavelengths or into a specific wavelength spectrum. In the case of a blue laser, the light has a wavelength of, for example, 450 nm and as a general rule is monochromatic. Through additive color mixing of the scattered light and the converted light a light image is created with a desired or specified color coordinate.

The light conversion element is also described as a converter (for example Ce: YAG), luminescent element or (Eng.) as phosphor, wherein the term "phosphor" herein is not to be understood as the chemical element of the same name but it rather refers to the characteristic of said substances, to luminesce. If not explicitly stated otherwise, the term "phosphor" in the sense of the current disclosure is always to be understood to be as a luminescent material, however not necessarily the chemical element of the same name.

Such illuminating devices based on laser light sources are of special significance because a high luminance can be attained in this manner, which is of particular relevance for applications in the automobile sector.

It is often an objective to achieve also an especially high luminance, in particular at a low laser performance, to not only achieve a high luminance but also to keep the energy consumption as low as possible. This can be achieved in that a light spot of small size, for example having a small diameter for example less than 500 micrometers, is produced with an accordingly high luminance.

The used phosphor can, on the one hand, be operated in transmission and, on the other hand, also in remission (reflectance). In remission applications, the phosphor can be cooled from the back.

German disclosure document DE 10 2012 223 854 A1 describes a remote phosphor converter device, comprising a mount which includes a converter element supported by said mount, as well as a primary light radiating element which is designed in such a manner, that a primary light emitted from same can be directed onto the converter element.

U.S. patent application US 2017/0210277 A1 describes a semiconductor LED device wherein the luminance decreases slightly in longitudinal direction.

U.S. patent application US 2017/0210280 A1 describes a headlight device for vehicles which is designed such, that different light distribution patterns can be set at low energy usage.

U.S. patent application US 2017/0198876 A1 describes an illuminating device which is equipped with a curved light conversion element, as well as a vehicle headlight which includes such an illuminating device.

A method for controlling a vehicle headlight and a related vehicle headlight is disclosed in European patent application EP 3 184 884 A1. The vehicle headlight includes at least one laser diode and one light conversion element associated with the laser diode. Regions of the light conversion element which correspond to different regions of the light image can be illuminated periodically and with varying intensity by a light beam of the laser diode, so that the illumination intensity in different regions of the light image are adjustable by the relative illuminating duration and/or by the varying light intensities of the laser diode in said regions.

International patent application WO 2017/133809 A1 describes an illumination device for emitting illuminating light. The illumination device includes an LED for emitting LED radiation and a laser for emitting laser radiation as well as a luminescent material element for at least partial conversion of the LED and laser radiation into conversion light. During operation of the illuminating device, the regions in which the LED light or, respectively, the laser light is illuminated overlap at least partially on the luminescent material element.

European patent application EP 3 203 140 A1 describes an illumination device for a vehicle and an associated operating method. The illumination device includes a pixel light source and an anamorphic element which can be illuminated at least partially by a light distribution from the pixel light source.

Chinese patent application CN 106939991 A describes a vehicle headlight based on laser excitation of an optical fluorescent fiber, including a laser module, an optical fiber, and an optical fluorescent fiber. In this manner, a vehicle headlight of compact design is produced.

International patent application WO 2017/111405 A1 describes a phosphor plate arrangement, an arrangement for emitting light and a vehicle headlight comprising said arrangement.

International patent application WO 2017/104167 A1 describes an illumination device and a vehicle headlight. The illumination device includes a light emitting device with luminescent material which emits lights based on excitation through the light of the laser element, and a movable mirror and which moves continuously in a predetermined motion.

What is needed in the art is an illumination device that addresses some of the shortcomings of known illumination devices.

SUMMARY OF THE INVENTION

It has been found that known illumination devices in regard to alignment and/or centering of a light spot have further room for improvement in respect to a secondary optic. Exemplary embodiments provided according to the present invention align or center a light spot with high precision in respect to a secondary optic, which makes it possible to provide high or remarkably high luminance and, in some embodiments, white light. For this purpose, an illumination device, a suitable light conversion device, a suitable base body and related methods for the production and/or processing are provided according to the present invention. One aspect provided by exemplary embodiments disclosed herein is high precision, in other words, low tolerances and avoiding of tolerance buildup.

In some exemplary embodiments provided according to the present invention, a light conversion device includes: a base body in the form of a heat sink, the base body including a front side; and a light conversion element mounted on the front side of the base body, the light conversion element having a front side facing away from the base body and which is configured to be illuminated with primary light on the front side and to emit secondary light with another wavelength on the front side. The base body includes at least one of: an indicator configured for positioning and alignment on the base body of the light conversion element which is mounted on the base body; or at least one indicator configured for positioning and alignment of the base body together with the light conversion element mounted thereupon.

In some exemplary embodiments provided according to the present invention, an illuminating device includes: a light conversion device including a base body and a light conversion element mounted on a front of the base body, the light conversion element having a front side facing away from the base body and which is configured to be illuminated with primary light on the front side and to emit secondary light with another wavelength on the front side, the base body including at least one of: an indicator configured for positioning and alignment on the base body of the light conversion element which is mounted on the base body; or at least one indicator configured for positioning and alignment of the base body together with the light conversion element mounted thereupon; and a light emitting unit configured to emit primary light for illumination of the front side of the light conversion element.

In some exemplary embodiments provided according to the present invention, a base body for at least one of a light conversion device or an illuminating device is configured in the form of a heat sink and including: a front side which is configured to mount a light conversion element on the base body; and at least one of: an indicator configured for positioning and alignment of a light conversion element on the base body; or at least one indicator configured for positioning and alignment of the base body relative to a component for holding the base body.

In some exemplary embodiments provided according to the present invention, a method for producing a light conversion device includes: providing a light conversion device including a base body and a light conversion element mounted on a front of the base body, the base body including at least one indicator configured for positioning and alignment of the base body together with the light conversion element mounted thereupon; and centering secondary light emitted by the light conversion element relative to an optic that is subordinate to the light conversion element using the at least one indicator configured for positioning and alignment of the base body together with the light conversion element mounted thereupon.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

In some exemplary embodiments provided according to the present invention, a light conversion device is described, which includes a base body that is in the embodiment of a heat sink and a light conversion element which is mounted indirectly or directly on the front of the base body. The rear of the light conversion element faces the front of the base body, whereas the front of the light conversion element faces away from the base body.

The front of the light conversion element facing away from the base body is configured to be illuminated with primary light and to emit secondary light of another wavelength. The light conversion element is thus configured to be illuminated on its front with primary light and to again emit the secondary light on the front side. In other words, the light conversion element is configured for remission (reflectance) operation. Due to this remission arrangement, the light conversion element can be cooled from the rear by a base body in the embodiment of a heat sink.

According to the present invention, the base body includes an indicator for positioning/alignment of the light conversion element on the base body and/or an indicator for positioning/alignment of the base body together with the light conversion element mounted thereupon.

On the one hand, the base body may include an indicator for positioning and/or alignment of the light conversion element on the base body, so that the light conversion element that is mounted on the base body can be positioned/aligned by this indicator. The indicator for the light conversion element can also be in the embodiment of a bracket, being able at the same time to support and/or mount the light element.

On the other hand, the base body can alternatively or in addition include at least one indicator, such as several indicators, for positioning and/or alignment of the base body together with the light conversion element mounted thereupon. This indicator or indicators thus position and/or align the base body itself or position and/or align the base body relative to another component not associated with the light conversion device, for example an external component for retaining the base body, on which the base body is, for example, mounted.

With an indicator for positioning/alignment of the light conversion element on the base body and/or an indicator for positioning/alignment of the base body together with the light conversion element mounted thereupon—which respectively can be designed as a structure integrated into the base body—centering of the light spot relative to a secondary optic can occur in an advantageous manner, wherein in particular a tolerance buildup of different components is avoided. A solution is thus specified for aligning and/or centering the light spot with high precision relative to a secondary optic.

According to the present invention, it is thus possible that a light conversion element can be actively or passively calibrated relative to an indicator. As will be outlined in further detail herein, a heat sink can, for example, be used as the base body, the front and/or back of which are realized with markings and/or depressions/elevations so that the light conversion element can be calibrated passively or actively, such as centrically relative to a marking/depression/elevation.

With the light conversion device which can be used in an illumination device with a laser for radiation of the light conversion elements with the primary light, high luminance can be achieved, as further explained herein. This is particularly significant for applications in the automobile sector, in the aircraft sector, in medical illumination and in the general illumination sector, such as stage and search lights. It is thus possible to achieve an especially high luminance also, and in particular at a low laser performance, not only to achieve a high luminance but also to keep the energy consumption as low as possible. For this, a light spot of small size can be provided, for example one having a small diameter, however with an accordingly high luminance.

The light conversion element mounted on the base body can be arranged directly or indirectly on the base body. In the case that the light conversion element is mounted indirectly on the base body, the light conversion device can, for example, include an intermediate element that is mounted to the base body on which in turn the light conversion element is arranged. Such an intermediate element can also be in the form of an alignment element so that alignment of the light conversion element relative to the primary light and/or alignment of the secondary light relative to a subordinate optic is possible. The light conversion element however may be arranged directly on the base body, The indicator for positioning/alignment of the light conversion element on the base body can be integrated into the base body or can be arranged as a separate element on the base body. The indicator for positioning/alignment of the light conversion element may be designed integrally with the base body. The indicator may be formed by the material of the base body itself. The base body with the indicator for positioning/alignment of the light conversion element can be designed to be monolithic.

The indicator for positioning/alignment of the base body together with the light conversion element mounted thereupon can also be integrated into the base body or can be arranged on the base body as a separate element. It however may be designed integrally with the base body. The indicator may be formed by the material of the base body itself. The base body with the indicator for positioning/alignment of the light conversion element can again be designed to be monolithic.

The indicator for positioning/alignment of the light conversion element on the base body and/or the indicator for positioning/alignment of the base body together with the light conversion element mounted thereupon is designed with an accuracy of better than 500 micrometers, such as better than 100 micrometers or better than 50 micrometers. The tolerance of the indicator or the indicators may be less than the specified values. The present invention relates thus also to a set with a plurality of light conversion devices, each in particular as previously described, wherein the position difference of the indicator or the indicators between the individual light conversion devices of the plurality of light conversion devices is less than the previously described values.

In some embodiments, the indicator for positioning/alignment of the light conversion element is designed in the form of a marking on or in the base body. The marking can, for example, be imprinted. The marking may, however, be introduced integrally into the material, for example by laser ablation or etching.

The indicator for positioning/alignment of the light conversion element can moreover be in the form of an elevation or depression. Such an elevation or depression can, for example, be produced by arranging of additional elements on the base body. The elevation or depression may, however, be formed integrally in the material of the base body, for example at the time of manufacture or subsequently through embossing.

Regarding the at least one indicator for positioning/alignment of the base body, together with the light conversion element mounted thereupon, or regarding the indicator for positioning/alignment of the base body itself or relative to a component for retention of the base body, the aforementioned designs of marking and/or elevation or depression are also considered. The indicator for positioning/alignment of the base body may be designed in the form of a cavity in the base body. A cavity can be in the form of a depression, in particular a through-cavity, in particular transversely or perpendicular to the front of the base body. In other words, a through-cavity may extend transversely or perpendicular relative to the front of the base body, in or through the base body.

A cavity, in particular a through-cavity which extends transversely or perpendicular relative to the front of the base body, in or through the base body can, for example, be open laterally to the outside. On the other hand, a cavity, in particular a through-cavity extending transversely or perpendicular relative to the base body, in or through the base body can also be closed laterally to the outside so that the cavity can be designed in particular as a hole or bore. In some embodiments, several cavities are provided in the base body, wherein at least one cavity is open laterally to the outside and one cavity is closed laterally to the outside. Thus, four cavities may, for example, be provided, wherein two of them are open laterally to the outside and the other two are closed laterally to the outside.

Regardless as to how the indicator or the indicators are precisely designed, the indicator for positioning/alignment of the light conversion element on the base body and/or the indicator for positioning/alignment of the base body together with the light conversion element mounted thereupon can be configured to enable centering of the secondary light emitted from the light conversion element relative to an optic, subordinate to the light conversion element.

The present invention further relates to an illumination device with a light conversion device, in particular as previously described, in other words with a base body and a light conversion element mounted on the base body, and further relates to a light emitting unit which is designed to emit the primary light for illumination of the front of the light conversion element. The light emitting unit is therefore configured to radiate the light conversion element with primary light, wherein the light emitting unit is arranged or configured to radiate the light conversion element on its front side with the primary light. As described previously for the light conversion device, the base body has an indicator on the base body for positioning/alignment of the light conversion element mounted on the base body and/or at least one indicator for positioning/alignment of the base body together with the light conversion element mounted thereupon, wherein reference is made to the previous statements in this regard.

The illumination device may include an optic, subordinate to the light conversion element for capture, in particular for formation of the secondary light which can be emitted by the light conversion element. The indicator for positioning/alignment of the light conversion element on the base body and/or the indicator for positioning/alignment of the base body together with the light conversion element mounted thereupon in this case may be configured to enable centering of the secondary light emitted by the light conversion element relative to an optic, subordinate to the light conversion element.

The light emitting unit emitting the primary light can include a laser light source or can be designed as such. However, a laser light source is not absolutely necessarily included. For example, only a light conductor may be included to emit the primary light, wherein the light conductor may be connected with a laser light source to couple the light into the light conductor. The illumination device therefore includes at least one light emitting unit which is designed to emit the primary light.

In some embodiments, the light emitting unit can include a light source, such as a laser light source which is configured to emit the primary light for illuminating the light conversion element.

Alternatively or in addition it may also be provided that the light emitting unit includes a light conductor, such as a fiber light conductor which is configured to emit the primary light for illuminating the light conversion element.

The light emitting unit of the illuminating device may be arranged so that the primary light is irradiated laterally into the light conversion element, wherein the primary light is irradiated in particular along an optical axis which has an angle relative to a normal axis of the light conversion element and/or relative to an optical axis of the secondary light of greater than 30 degrees, such as greater than 45 degrees or greater than 60 degrees.

The light emitting unit can moreover be configured and/or arranged in such a way that the primary light receiving surface inside of which the light conversion element is illuminated by the primary light is smaller than 1 square millimeter, such as smaller than 0.5 square millimeter or smaller than 0.2 square millimeter.

The light emitting unit which emits the primary light has a radiant power of at least 0.5 W. It can moreover be provided that the secondary light has a luminance of at least 50 cd/mm2.

The present invention moreover relates to a base body for a light conversion device and/or an illuminating device, in particular as previously described, wherein the base body is configured as a heat sink, wherein the base body has a front side which is configured to mount a light conversion element onto the base body.

The base body may include an indicator for positioning/alignment of the light conversion element on the base body and/or an indicator for positioning/alignment of the base body itself or the base body relative to an external component, for example for holding the base body.

For the indicator or the indicators, reference is made to the previous explanations regarding the light conversion device or the illumination device. An indicator can therefore be designed integrally or monolithic in the base body, wherein an accuracy of better than 500 micrometers, such as better than 100 micrometers or better than 50 micrometers, can be provided.

The indicator for positioning/alignment of the light conversion element can, for example, be configured as a marking on the base body and/or as an embossing or depression on the base body, wherein reference is made again to the previous explanations.

The at least one indicator for positioning/alignment of the base body itself or in relation to a component for retention of the base body can be in the form of a cavity in the base body, in particular a through-cavity extending transversely or perpendicular relative to the front side of the base body. One cavity or several cavities, in particular a through-cavity extending for example transversely or perpendicular relative to the front side of the base body in, or through the base body can be open laterally toward the outside and/or can be laterally closed on all sides, wherein reference is again made to previous explanations in this regard.

The present invention relates to a method for processing of a base body which, in particular is in the embodiment of a heat sink. In the method, a base body is provided and an indicator for positioning/alignment of a light conversion element on the base body and/or an indicator for positioning/alignment of the base body itself or respectively relative to a component for retention of the base body is developed.

The indicator for positioning/alignment of the light conversion element on the base body may be designed to be integral, in particular with an accuracy of better than 500 micrometers, such as better than 100 micrometers or better than 50 micrometers.

The indicator for positioning/alignment of the base body relative to a component for retention of the base body may also be designed integrally into the base body, in particular with an accuracy of better than 500 micrometers, such as better than 100 micrometers or better than 50 micrometers.

An indicator for positioning/alignment of the light conversion element can essentially be designed as marking in the base body, for example by laser processing.

On the other hand, an indicator for positioning/alignment of the light conversion element can be designed in the form of an elevation or depression in the base body, for example by embossing.

The at least one indicator for positioning/alignment of the base body relative to a component for retention of the base body can be designed as a cavity in the base body, in particular a through-cavity extending in the base body transversely or perpendicular relative to the front side of the base body, wherein a cavity is incorporated, for example, by boring.

A cavity can be incorporated so that it extends in the base body transversely or perpendicular relative to the front side of the base body. The cavity can moreover be incorporated so that it is laterally open toward the outside or that it is laterally closed on all sides. As described further previously, several cavities may also be introduced, wherein at least one of them is introduced such, that it is laterally open and at least one of them is introduced such that it is laterally closed on all sides.

The present invention further relates to a method for producing a light conversion device. With this method, a base body is provided which is designed in particular as a heat sink, wherein the base body includes an indicator for positioning/alignment of a light conversion element on the base body. In this method, a light conversion element is mounted onto the base body, in particular by the indicator for positioning/alignment of a light conversion element on the base body.

The present invention further relates to a method for producing an illuminating device. Herein, a light conversion device is provided with a base body and a light conversion element mounted on the front side of the base body, wherein the base body includes at least one indicator for positioning/alignment of the base body together with the light conversion element mounted thereto. With the method, the light conversion element—in particular the secondary light emitted from the light conversion element—is then aligned, in particular centered, relative to a subordinate optic by the indicator for positioning/alignment of the base body together with the light conversion element mounted thereupon.

Figure 1:
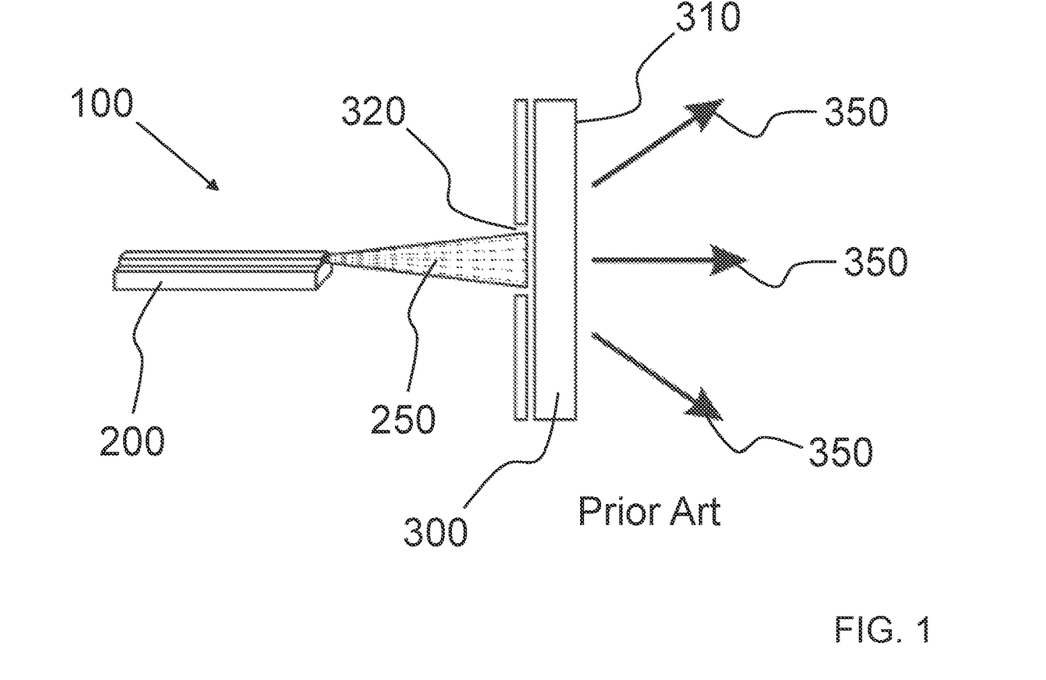
FIG. 1 illustrates an illuminating device known from the prior art, wherein a light conversion element (converter) is deployed in the transmission mode.

Referring now to the drawings, FIG. 1 illustrates an illumination device 100 known from the current state of the art, which is designed for transmission mode. Illuminating device 100 includes a light emitting unit 200 in the embodiment of a laser diode with which primary light 250, for example blue light, is radiated onto backside 320 of a light conversion element 300. Light conversion element 300 consequently receives primary light 250 on backside 320 and emits secondary light 350 on front side 310.

Figure 2:
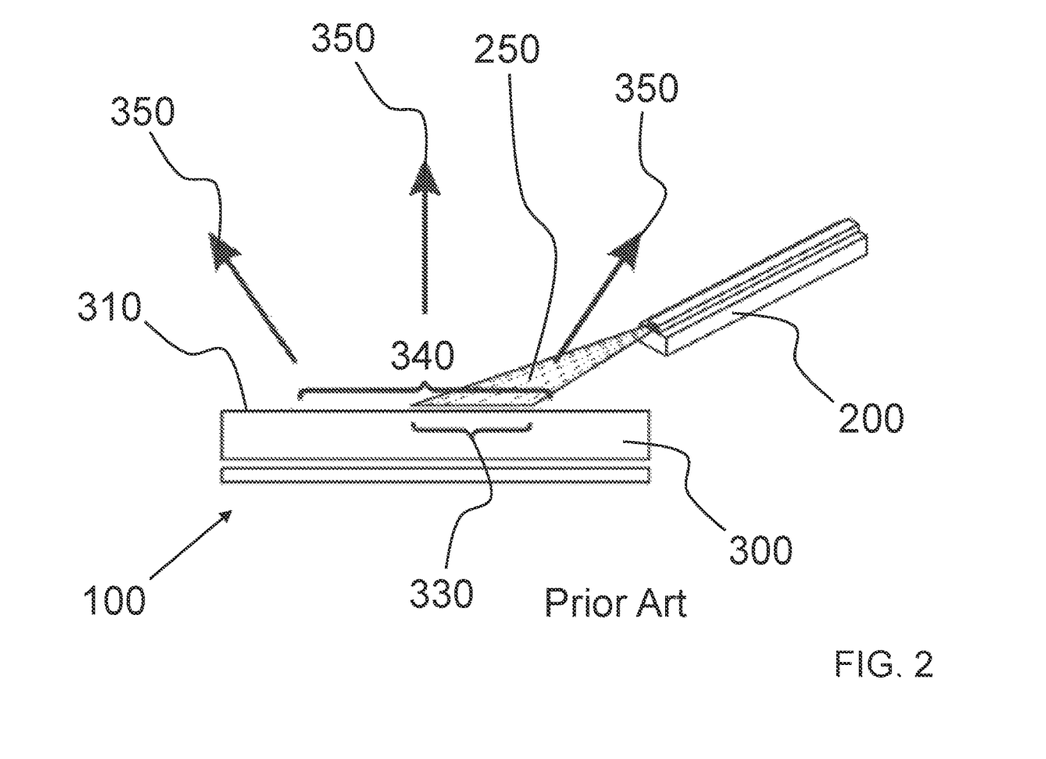
FIG. 2 illustrates an illuminating device with which a converter is deployed in the remission mode.

FIG. 2 illustrates a similar illuminating device 100 which, however, is designed from remission (reflectance) mode. Here, light emitting unit 200 radiates primary light 250 onto front side 310 of light conversion element 300. The front side is illuminated in the region of a primary light receiving surface 330. Light conversion element 300 emits secondary light 350 at front side 310 in the region of a secondary light emitting surface 340.

Figure 3:
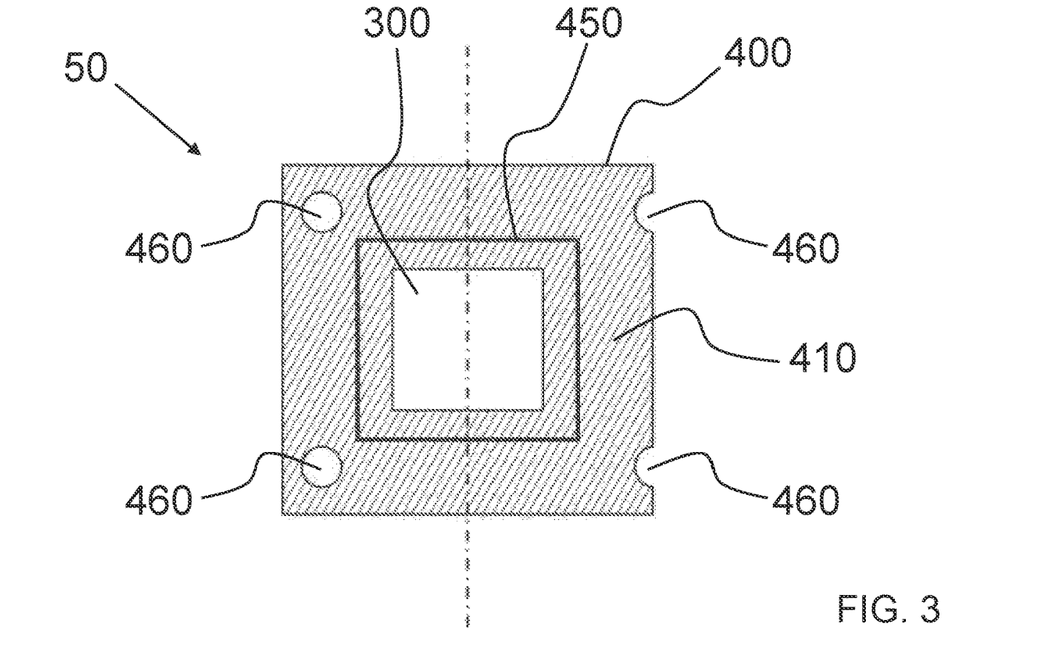
FIG. 3 is a top view of an exemplary embodiment of a light conversion device with a base body and a light conversion element arranged thereupon, provided in accordance with the present invention.
Figure 4:
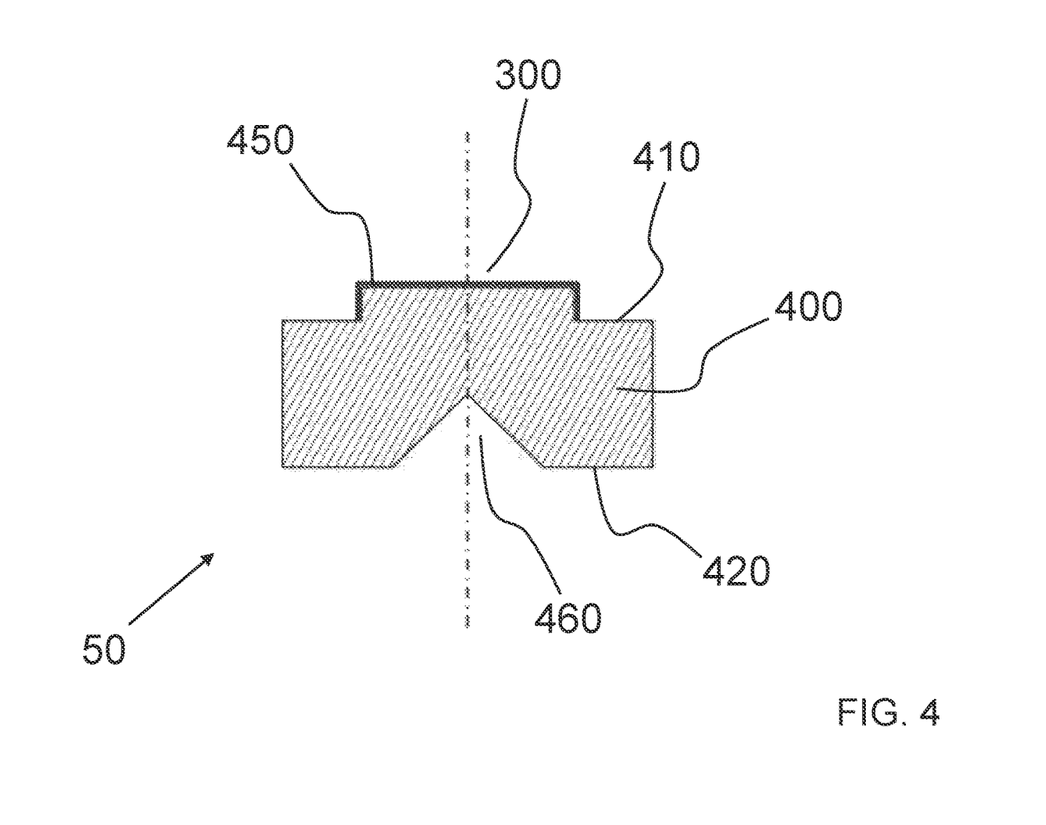
FIG. 4 is a lateral sectional view of the light conversion device of FIG. 3.

FIGS. 3 and 4 illustrate an exemplary embodiment of a light conversion device 50 provided according to the present invention, which can be used, for example, for an illuminating device 100. The light conversion device 50 includes a base body 400 in the embodiment of a heat sink on which a light conversion element 300 is mounted.

On its front side 410, base body 400 includes an indicator 450 for positioning/alignment of light conversion element 300 on base body 400. Indicator 450, in this example, is designed as an elevation on base body 400, or more precisely, as an elevation on front side 410 of base body 400. Indicator 450, designed in this example as an elevation, is arranged centrally on front side 410 of the base body 400, so that the associated light conversion element 300, which is mounted by indicator 450, is arranged centrally on front side 410 of base body 400.

Base body 400 moreover includes indicators 460 for positioning/alignment of base body 400 together with light conversion element 300 mounted thereupon, wherein these can also be designated as indicators 460 for positioning/alignment of base body 400 itself or base body 400 relative to a component for retention of base body 400. In each case, the indicators 460 are designed as a through-cavity, perpendicular relative to front side 410 or rear side 420 of the base body. The through-cavities extend thus through base body 400 from front side 410 to backside 420 of base body 400. As can be seen in FIG. 3, indicators 460 are located on one side of the base body—in this example two—which are laterally open to the outside, whereas on the opposite side of base body 400 indicators 460 are located which are laterally closed on all sides—in this sample also two. In FIG. 4, it can be seen that an indicator 460, in this case in the form of a cavity or depression, is located in addition on backside 420 of base body 400, whereby said indicator 460 is arranged specifically centrally.

Figure 5:
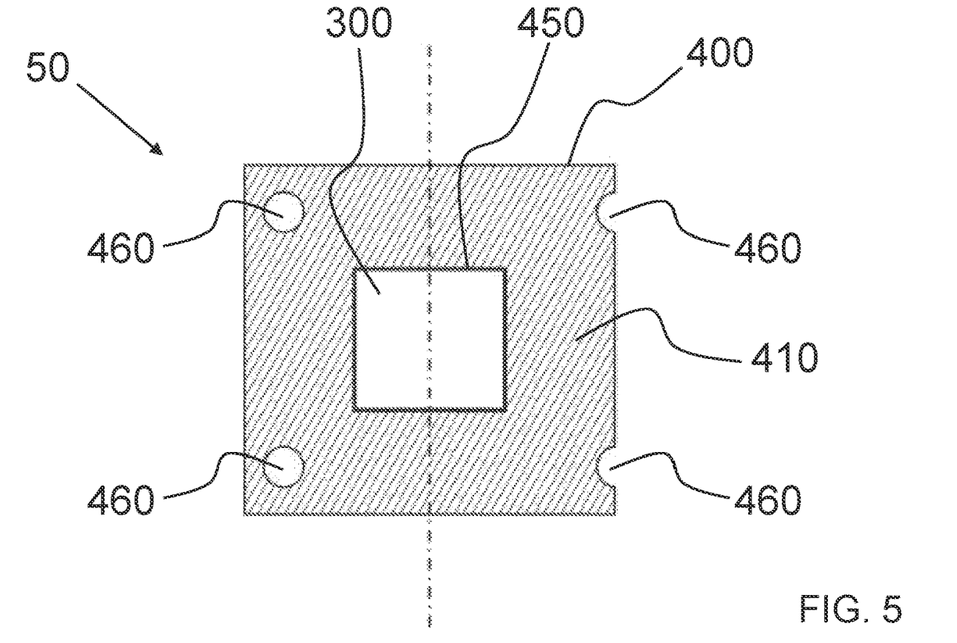
FIG. 5 is a top view of another exemplary embodiment of a light conversion device with a base body and a light conversion element arranged thereupon, provided in accordance with the present invention.
Figure 6:
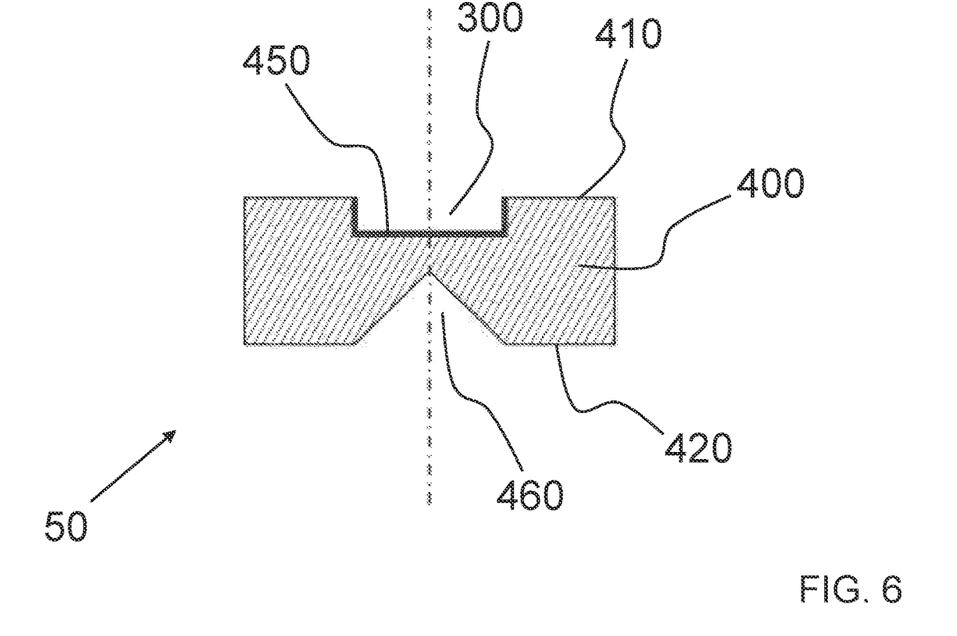
FIG. 6 is a lateral sectional view of the light conversion device of FIG. 5.

FIGS. 5 and 6 illustrate another exemplary embodiment of a light conversion device 50 provided according to the present invention. The light conversion device 50 includes a base body 400 in the embodiment of a heat sink on which a light conversion element 300 is mounted. For this embodiment, the previous explanations regarding the light conversion device 50 of FIGS. 3 and 4 essentially apply. Deviating from this is an indicator 450 provided on front side 410 of base body 400 for positioning/alignment of light conversion element 300 on base body 400, which in this case is designed as a depression in base body 400, or more precisely as a depression in front side 410 of base body 400. At the same time, indicator 450 also serves as mount for light conversion element 300. It may be provided that light conversion element 300 is perfectly fitted into the depression.

Figure 7:
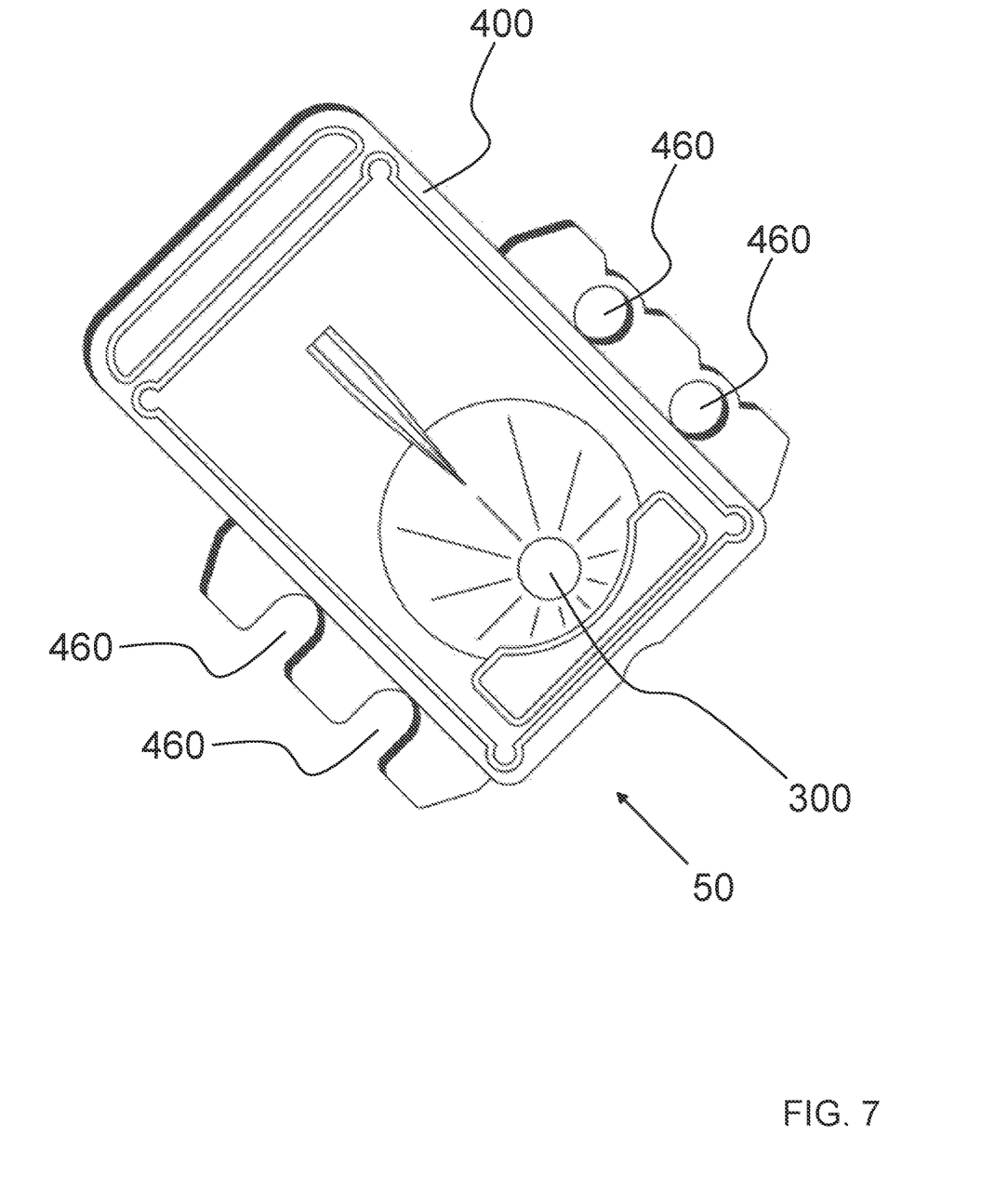
FIG. 7 is a photograph of a light conversion device with a base body and a light conversion element arranged thereupon.

By having indicators 450, 460 provided in the two aforementioned design variations of light conversion device 50, centering of the secondary light emitted from the respective light conversion element 300 relative to an optic that is subordinate to light conversion element 300 is made possible. Converter 300 can herein specifically be passively or actively centrally adjusted to lower marking/depression 460. The markings and/or depressions can, for example, be produced by a simple embossing procedure. FIG. 7 shows a photograph of a light conversion device 50, produced according to the present invention.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:
1. A light conversion device, comprising
   a base body in the form of a heat sink, the base body including a front side; and
   a light conversion element mounted on the front side of the base body, the light conversion element having a front side facing away from the base body and which is configured to be illuminated with primary light on the front side and to emit secondary light with another wavelength on the front side, wherein the base body includes:
  a first indicator configured for positioning and alignment on the base body of the light conversion element which is mounted on the base body, wherein the first indicator configured for positioning and alignment of the light conversion element is in the form of a depression in the base body and the light conversion element is fitted into the depression so the light conversion element covers an entirety of a surface of the depression opposite an opening of the depression, wherein the first indicator configured for positioning and alignment of the light conversion element is arranged centrally on the base body, and
  the base body additionally comprises a second indicator for alignment of the base body including the light conversion element, said second indicator for alignment of the base body including the light conversion element being configured as a depression arranged centrally on the back side of the base body such that the first indicator and the second indicator as well as the light conversion element are arranged on the same axis.

2. The light conversion device of claim 1, wherein at least one of:
  the first indicator configured for positioning and alignment of the light conversion element on the base body is integral with the base body and with an accuracy of better than 500 micrometers; or
  the second indicator configured for positioning and alignment of the base body together with the light conversion element mounted thereupon is integral with the base body and with an accuracy of better than 500 micrometers.

3. The light conversion device of claim 1, wherein at least one of:
  the first indicator configured for positioning and alignment of the light conversion element on the base body is configured to enable centering of secondary light emitted from the light conversion element relative to an optic that is subordinate to the light conversion element; or
  the second indicator configured for positioning and alignment of the base body together with the light conversion element mounted thereupon is configured to enable centering of secondary light emitted from the light conversion element relative to an optic that is subordinate to the light conversion element.

4. An illuminating device, comprising:
  a light conversion device including a base body and a light conversion element mounted on a front of the base body, the light conversion element having a front side facing away from the base body and which is configured to be illuminated with primary light on the front side and to emit secondary light with another wavelength on the front side, the base body including:
    a first indicator configured for positioning and alignment on the base body of the light conversion element which is mounted on the base body, wherein the first indicator configured for positioning and alignment of the light conversion element is in the form of a depression in the base body and the light conversion element is fitted into the depression so the light conversion element covers an entirety of a surface of the depression opposite an opening of the depression, wherein the first indicator configured for positioning and alignment of the light conversion element is arranged centrally on the base body, and
    the base body additionally comprises a second indicator for alignment of the base body including the light conversion element, said second indicator for alignment of the base body including the light conversion element being configured as a depression arranged centrally on the back side of the base body such that the first indicator and the second indicator as well as the light conversion element are arranged on the same axis; and
  a light emitting unit configured to emit primary light for illumination of the front side of the light conversion element.

5. The illuminating device of claim 4, further comprising an optic that is subordinate to the light conversion element for capture and formation of secondary light, wherein at least one of:
  the first indicator configured for positioning and alignment of the light conversion element on the base body is configured to enable centering of secondary light emitted by the light conversion element relative to the optic that is subordinate to the light conversion element; or
  the second indicator configured for positioning and alignment of the base body together with the light conversion element mounted thereupon is configured to enable centering of secondary light emitted by the light conversion element relative to the optic that is subordinate to the light conversion element.

6. The illuminating device of claim 4, wherein the light emitting unit includes at least one of:
  a laser light source which is configured to emit primary light for illuminating the light conversion element;
  a fiber light conductor which is configured to emit primary light for illuminating the light conversion element; or
  a lens which is configured to emit primary light for illuminating the light conversion element.

7. The illuminating device of claim 4, wherein the light emitting unit is arranged so that the primary light is irradiated laterally into the light conversion element along an optical axis which has an angle of greater than 30 degrees relative to at least one of a normal axis of the light conversion element or an optical axis of secondary light.

8. The illuminating device of claim 4, wherein the light emitting unit is at least one of configured or arranged in such a way that at least one of:
  a primary light receiving surface inside of which the light conversion element is illuminated by primary light is smaller than 1 square millimeter; or
  the light emitting unit has a radiant power of at least 0.5 W.

9. A base body for at least one of a light conversion device or an illuminating device, the base body being configured in the form of a heat sink and comprising:
  a front side which is configured to mount a light conversion element on the base body; and
    a first indicator configured for positioning and alignment of a light conversion element on the base body, wherein the first indicator configured for positioning and alignment of the light conversion element is in the form of a depression in the base body and a mounting area for the light conversion element is fitted into the depression so the light conversion element covers an entirety of a surface of the depression opposite an opening of the depression, and wherein the first indicator configured for positioning and alignment of the light conversion element is arranged centrally on the base body, and the base body additionally comprises a second indicator for alignment of the base body including the light conversion element, said second indicator for alignment of the base body including the light conversion element being configured as a depression arranged centrally on the back side of the base body such that the first indicator and the second indicator as well as the light conversion element are arranged on the same axis.

10. The base body of claim 9, wherein at least one of:

the first indicator configured for positioning and alignment of the light conversion element on the base body is integral with the base body with an accuracy of better than 500 micrometers; or the second indicator configured for positioning and alignment of the base body relative to a component for holding the base body is integral with the base body with an accuracy of better than 500 micrometers.

11. A method for producing a light conversion device, the method comprising:

providing a light conversion device including a base body and a light conversion element mounted on a front of the base body, the base body including a first indicator configured for positioning and alignment on the base body of the light conversion element which is mounted on the base body and a second indicator configured for positioning and alignment of the base body together with the light conversion element mounted thereupon, wherein the first indicator configured for positioning and alignment of the light conversion element is in the form of a depression in the base body, wherein the first indicator configured for positioning and alignment of the light conversion element is arranged centrally on the base body, and the light conversion element is fitted into the depression so the light conversion element covers an entirety of a surface of the depression opposite an opening of the depression, and the second indicator for alignment of the base body including the light conversion element being configured as a depression arranged centrally on the back side of the base body such that the first indicator and the second indicator as well as the light conversion element are arranged on the same axis; and centering secondary light emitted by the light conversion element relative to an optic that is subordinate to the light conversion element using the second indicator configured for positioning and alignment of the base body together with the light conversion element mounted thereupon.

* * * * *